(12) United States Patent
Magnus

(10) Patent No.: US 10,056,360 B2
(45) Date of Patent: Aug. 21, 2018

(54) LOCALIZED REDISTRIBUTION LAYER STRUCTURE FOR EMBEDDED COMPONENT PACKAGE AND METHOD

(71) Applicant: NXP USA, INC., Austin, TX (US)

(72) Inventor: Alan J. Magnus, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/599,667

(22) Filed: May 19, 2017

(65) Prior Publication Data
US 2017/0256525 A1 Sep. 7, 2017

Related U.S. Application Data

(62) Division of application No. 14/860,426, filed on Sep. 21, 2015, now Pat. No. 9,691,743.

(51) Int. Cl.
*H01L 21/48* (2006.01)
*H01L 23/00* (2006.01)
(Continued)

(52) U.S. Cl.
CPC .......... *H01L 25/16* (2013.01); *H01L 21/4857* (2013.01); *H01L 21/56* (2013.01); *H01L 23/3121* (2013.01); *H01L 23/49822* (2013.01); *H01L 23/49838* (2013.01); *H01L 23/66* (2013.01); *H01L 24/09* (2013.01); *H01L 24/19* (2013.01); *H01L 24/20* (2013.01); *H01L 24/96* (2013.01); *H01L 24/97* (2013.01); *H01L 25/0655* (2013.01); *H01L 25/50* (2013.01); *H01L 21/561* (2013.01); *H01L 21/568* (2013.01); *H01L 23/3157* (2013.01); *H01L 23/3171* (2013.01); *H01L 23/3185* (2013.01); *H01L 23/522* (2013.01); *H01L 23/528* (2013.01); *H01L 23/5226* (2013.01); *H01L 23/5389* (2013.01); *H01L 25/042* (2013.01);
(Continued)

(58) Field of Classification Search
CPC . H01L 2225/1041; H01L 24/20; H01L 24/23; H01L 23/5226; H01L 23/528; H01L 23/538; H01L 23/5386; H01L 23/522
See application file for complete search history.

(56) References Cited

U.S. PATENT DOCUMENTS

| 7,977,783 B1 | 7/2011 | Park et al. |
| 7,986,023 B2 | 7/2011 | Tews et al. |

(Continued)

*Primary Examiner* — David Zarneke

(57) ABSTRACT

An embedded component package includes an embedded component substrate. The embedded component substrate includes an electronic component having an active surface including bond pads and a package body encapsulating the electronic component. The package body includes a principle surface coplanar with the active surface, A localized redistribution layer (RDL) dielectric layer is on the active surface. A localized RDL conductive layer is on the localized RDL dielectric layer and is coupled to the bond pads through openings in localized RDL dielectric layer. A primary RDL dielectric layer encloses the entire embedded component substrate and directly contacts the localized RDL dielectric layer, the localized RDL conductive layer, and the principal surface of the package body. The localized RDL conductive layer provides additional space for routing of additional interconnects while the localized RDL dielectric layer acts as a stress buffer.

20 Claims, 6 Drawing Sheets

(51) Int. Cl.

| | | |
|---|---|---|
| *H01L 23/522* | (2006.01) | |
| *H01L 25/16* | (2006.01) | |
| *H01L 25/065* | (2006.01) | |
| *H01L 21/56* | (2006.01) | |
| *H01L 23/498* | (2006.01) | |
| *H01L 25/00* | (2006.01) | |
| *H01L 23/66* | (2006.01) | |
| H01L 25/075 | (2006.01) | |
| H01L 23/538 | (2006.01) | |
| H01L 25/07 | (2006.01) | |
| H01L 23/31 | (2006.01) | |
| H01L 23/528 | (2006.01) | |
| H01L 25/04 | (2014.01) | |
| H01L 25/11 | (2006.01) | |

(52) U.S. Cl.
CPC ........ *H01L 25/072* (2013.01); *H01L 25/0753* (2013.01); *H01L 25/115* (2013.01); *H01L 2223/6677* (2013.01); *H01L 2224/04105* (2013.01); *H01L 2224/08225* (2013.01); *H01L 2224/12105* (2013.01); *H01L 2924/14* (2013.01); *H01L 2924/19041* (2013.01); *H01L 2924/19042* (2013.01); *H01L 2924/19043* (2013.01); *H01L 2924/19105* (2013.01); *H01L 2924/3512* (2013.01)

(56) References Cited

U.S. PATENT DOCUMENTS

| | | |
|---|---|---|
| 8,405,213 B2 | 3/2013 | Chen et al. |
| 8,791,543 B2 | 7/2014 | Lenive et al. |
| 9,177,926 B2 | 11/2015 | Scanlan et al. |
| 9,484,307 B2 | 11/2016 | Tsai et al. |
| 9,520,373 B2 * | 12/2016 | Kim ................ H01L 24/19 |
| 9,711,379 B2 * | 7/2017 | Yu ................ H01L 21/568 |
| 2011/0156237 A1 | 6/2011 | Gulpen et al. |
| 2011/0187710 A1 | 8/2011 | Giovinazzi et al. |
| 2011/0221041 A1 | 9/2011 | Lin et al. |
| 2013/0168849 A1 | 7/2013 | Scanlan |
| 2013/0203240 A1 | 8/2013 | Reed et al. |
| 2014/0175663 A1 | 7/2014 | Chen et al. |
| 2014/0225224 A1 | 8/2014 | Zhu et al. |
| 2015/0108634 A1 | 4/2015 | Liu et al. |
| 2015/0187710 A1 | 7/2015 | Scanlan et al. |
| 2015/0318229 A1 | 11/2015 | Xu et al. |
| 2016/0351509 A1 | 12/2016 | Dang et al. |

\* cited by examiner

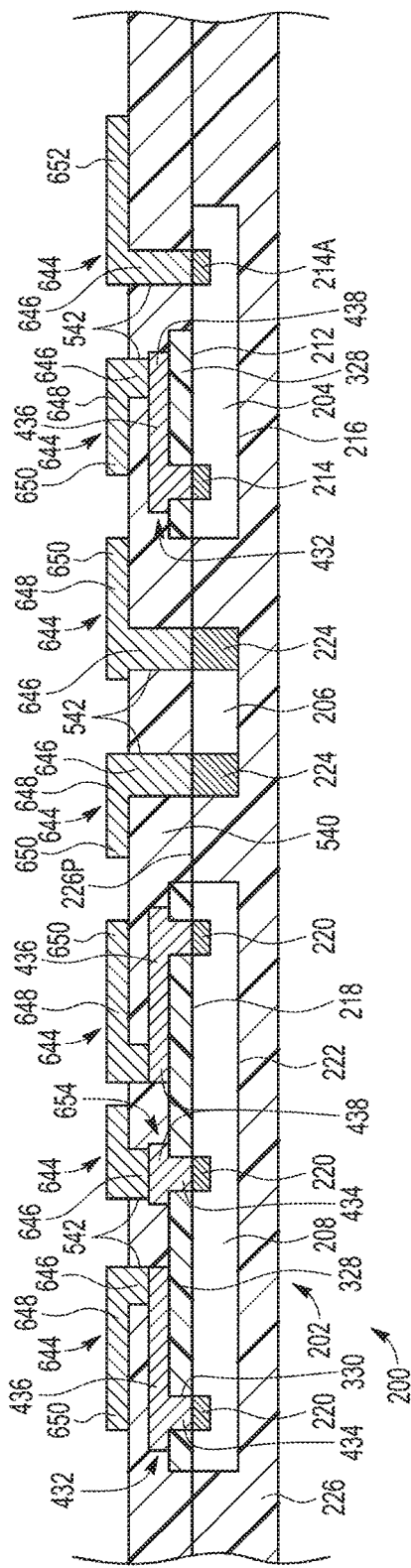
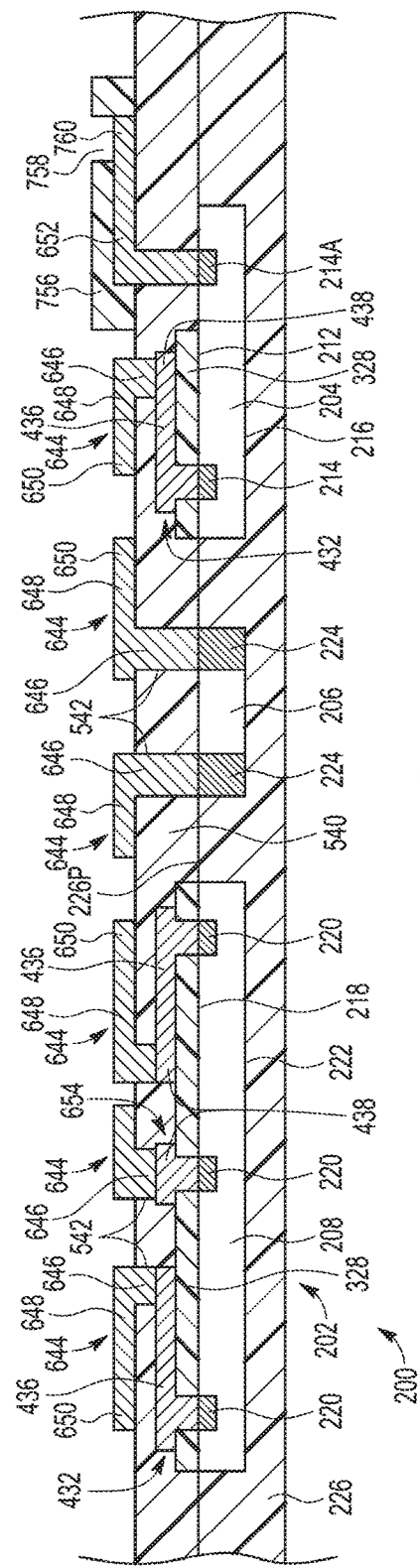
FIG. 6
FIG. 7

LOCALIZED REDISTRIBUTION LAYER STRUCTURE FOR EMBEDDED COMPONENT PACKAGE AND METHOD

This application is a divisional application of a U.S. patent application entitled "LOCALIZED REDISTRIBUTION LAYER STRUCTURE FOR EMBEDDED COMPONENT PACKAGE AND METHOD", having a serial number of Ser. No. 14/860,426, having a filing date of Sep. 21, 2015, having common inventors, and having a common assignee, all of which is incorporated by reference in its entirety.

FIELD

This disclosure relates generally to electronic component packages, and more specifically, to embedded component packages and methods associated therewith.

BACKGROUND

Fan Out Wafer Level Packaging (FOWLP) is a wafer-level packaging technique which allows the production of an embedded component package having multiple dies and passive components. The technique provides a package with a reduced footprint and an increased area for solder ball connection.

The embedded component package is formed by placing one or more electronic components, e.g., active components and passive components, onto an adhesive carrier with the electronic component terminals, e.g., bond pads, facing the carrier. The electronic components are then overmolded with a dielectric material, e.g., epoxy mold compound, to form an embedded component substrate. The embedded component substrate is a composite of the electronic components embedded within the dielectric material. The embedded component substrate is removed from the carrier.

To allow electrical interconnection with the embedded electronic components, a dielectric layer is blanket formed across the entire embedded component substrate and covers the embedded electronic components. Openings are formed in the dielectric layer to expose the terminals of the embedded electronic components. A metal layer is formed on the dielectric layer and extends through the openings to define circuitry to redistribute the pattern of terminals of the embedded electronic components. The process of forming dielectric layers and metal layers, sometimes called redistribution layer (RDL) dielectric layers and RDL metal layers, is repeated depending upon the redistribution desired.

To smooth the unevenness of the embedded component substrate, the thickness of the RDL dielectric layer applied to the embedded component substrate is relatively thick. The large thickness of the RDL dielectric layer prevents formation of high aspect ratio openings within the RDL dielectric layer and fine pitch RDL metal layers.

BRIEF DESCRIPTION OF THE DRAWINGS

FIGS. 3, 4, 5, 6, 7, 8, 9, and 10 are cross-sectional views of the embedded component package of FIG. 2 at further stages during fabrication in accordance with various embodiments.

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An embedded component package includes a localized redistribution layer (RDL) dielectric layer and a localized RDL conductive layer formed at select locations post panelization, i.e., after electronic components are encapsulated in a package body. The localized RDL dielectric layer is relatively thin and photo-definable. This allows small diameter openings to be formed in the localized RDL dielectric layer and for the localized RDL conductive layer to be fine pitched.

Figure 1:
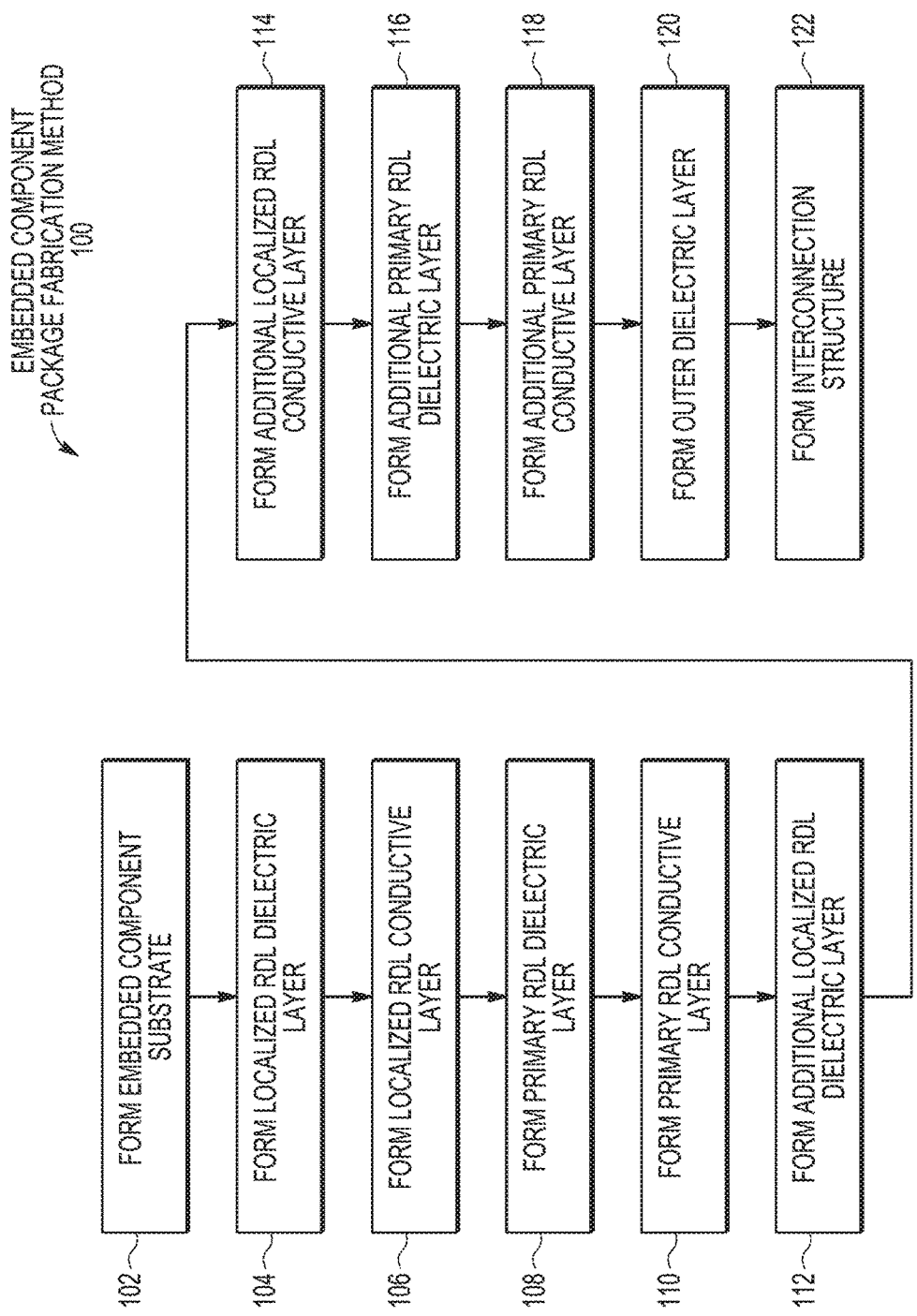
FIG. 1 is a flow diagram of an embedded component package fabrication method in accordance with one embodiment.
Figure 2:
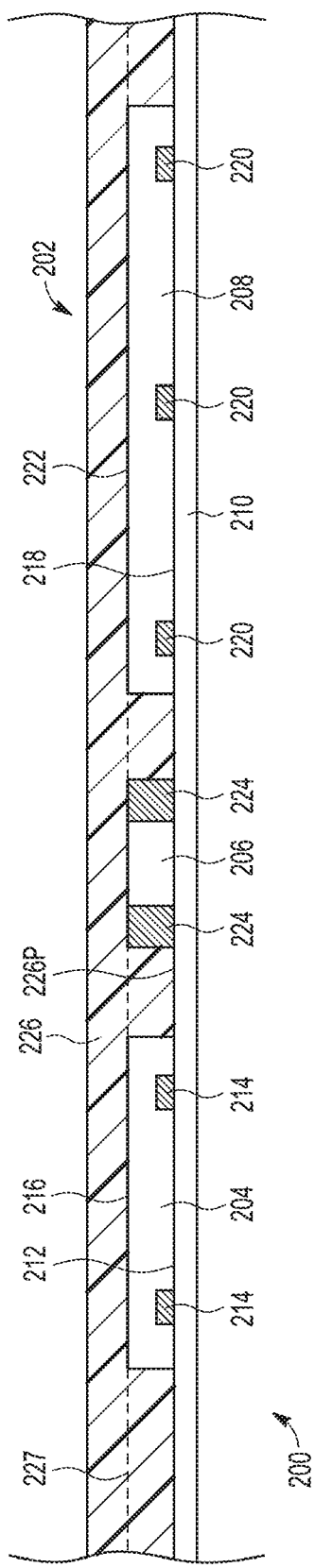
FIG. 2 is a cross-sectional view of an embedded component package during fabrication in accordance with one embodiment.

Now in more detail, FIG. 1 is a flow diagram of an embedded component package fabrication method 100 in accordance with one embodiment. FIG. 2 is a cross-sectional view of an embedded component package 200 during fabrication in accordance with one embodiment. In one embodiment, embedded component package 200 is a System in Package (SiP).

Referring now to FIGS. 1 and 2 together, an embedded component substrate 202 is formed (102). More particularly, to form embedded component substrate 202, one or more electronic components 204, 206, 208 are mounted to a carrier 210, e.g., an adhesive carrier.

In one embodiment, electronic components 204, 208 are active components, e.g., integrated circuit dies such as field-programmable gate array integrated circuit dies. Electronic component 204 includes an active, e.g., first, surface 212 having bond pads 214 thereon. Electronic component 204 further includes an inactive, e.g., second, surface 216 opposite active surface 212.

Similarly, electronic component 208 includes an active, e.g., first, surface 218 having bond pads 220 thereon. Electronic component 208 further includes an inactive, e.g., second, surface 222 opposite active surface 218. Bond pads 214, 220 form the input/output (I/O) terminals of electronic components 204, 208. Active surfaces 212, 218 are mounted to carrier 210.

In one embodiment, electronic component 206 is a passive component, e.g., a capacitor, resistor, or inductor. Electronic component 206 including terminals 224 thereof is mounted to carrier 210.

Although examples of electronic components 204, 206, 208 are set forth, in other embodiments, embedded component substrate 202 is formed with additional and/or different electronic components depending upon the particular application.

After mounting of electronic components 204, 206, 208 to carrier 210, electronic components 204, 206, 208 are encapsulated in a dielectric package body 226, e.g., epoxy molding compound. Package body 226 completely encloses electronic components 204, 206, 208 including the exposed portion of carrier 210. In one embodiment, package body 226 is back grinded to expose one or more of inactive surface 216, inactive surface 222, or electronic component 206 as indicated by the dashed line 227 of FIG. 2.

After formation of package body 226, package body 226 provides strength and rigidity to embedded component substrate 202 allowing embedded component substrate 202 to be removed from carrier 210. Package body 226 has a principle surface 226P parallel to and coplanar with active surfaces 212, 218.

Figure 3:
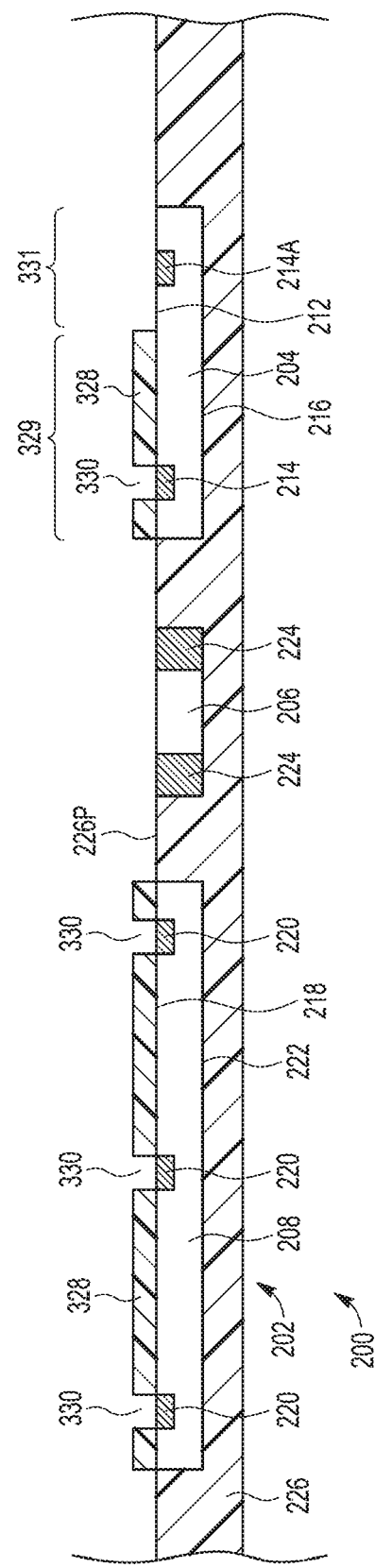

FIG. 3 is a cross-sectional view of embedded component package 200 of FIG. 2 at a further stage during fabrication in accordance with one embodiment. Note that in FIG. 3, embedded component substrate 202 is inverted from the view of FIG. 2.

Referring now to FIGS. 1 and 3 together, a next stage in processing is to form a localized redistribution layer (RDL) dielectric layer 328 (104).

More particularly, localized RDL dielectric layer 328 is formed selectively, i.e., at selective locations and not blanket formed across the entire embedded component substrate 202. In accordance with this embodiment, localized RDL dielectric layer 328 is formed only on electronic components 204, 208. For example, a dielectric layer is formed and then photo defined to form localized RDL dielectric layer 328.

In one embodiment, electronic component 208 is relatively large, e.g., active surface 218 of electronic component 208 is larger than active surface 212 of electronic component 204. Localized RDL dielectric layer 328 is formed on and covers the entire active surface 218 of electronic component 208.

For example, due to the relatively large size of electronic component 208, electronic component 208 is an area of high stress within embedded component package 200. The area of high stress is due to differential thermal expansion of electronic component 208 relative to conductive (metal) layers to be formed on electronic component 208. Localized RDL dielectric layer 328 is a photo-definable low modulus, high elongation dielectric material that acts as a stress buffer on electronic component 208. Low modulus of elasticity is desired when flexibility is needed; high elongation is the material's ability to stretch before breaking. Combined these properties tend to allow localized RDL dielectric layer 328 to absorb more energy before it breaks.

By acting as a stress buffer, localized RDL dielectric layer 328 minimizes the possibility of formation of cracks or other defects in the overlying dielectric layers and conductive layers thus improving reliability of embedded component package 200. Generally, localized RDL dielectric layer 328 as a photo-definable low modulus, high elongation dielectric material can be formed selectively in any high stress area, e.g., over large dies, stacked vias, filled vias, at surface mount contact areas, or other desired locations.

Further, localized RDL dielectric layer 328 is formed on only a first portion 329 of active surface 212 of electronic component 204 while leaving a second portion 331 exposed. Localized RDL dielectric layer 328 does not cover and is spaced apart from one or more of bond pads 214 on second portion 331, e.g., the bond pads 214A at the right edge of electronic component 204 in the view of FIG. 3. Localized RDL dielectric layer 328 is not formed in direct contact with package body 226 in this embodiment although extends onto principal surface 226P of package body 226 in another embodiment.

Openings 330, sometimes called via openings 330, are formed in localized RDL dielectric layer 328 extending to and exposing bond pads 214, 220 of electronic components 204, 208. Localized RDL dielectric layer 328 is relatively thin and photo-definable. This allows small diameter openings 330 to be formed to expose fine pitch bond pads 214, 220 individually. By exposing bond pads 214, 220 individually through openings 330, reliability is improved compared to forming a long trench to expose several of bond pads 214, 220 collectively within a trench. However, in another embodiment, openings 330 are trenches that expose a plurality of bond pads 214, 220 collectively.

Figure 4:
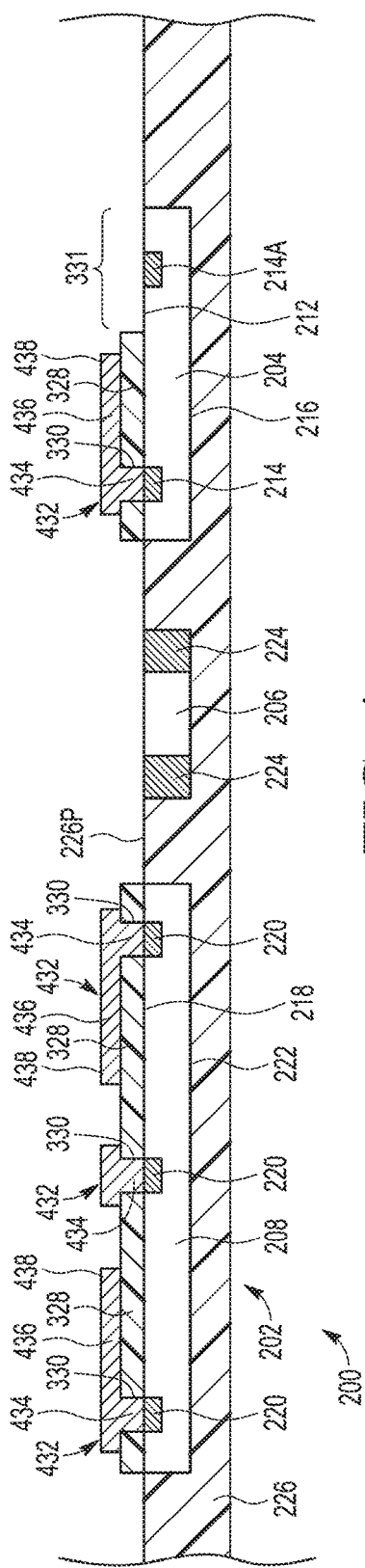

FIG. 4 is a cross-sectional view of embedded component package 200 of FIG. 3 at a further stage during fabrication in accordance with one embodiment. In FIG. 4, a first localized RDL conductive layer 432 is formed (106). For example, an electrically conductive material, e.g., metal including copper, is deposited and then etched to form localized RDL conductive layer 432. In another embodiment, electrically conductive material is selectively deposited, e.g., using a mask, to form localized RDL conductive layer 432.

Localized RDL conductive layer 432 is formed on localized RDL dielectric layer 328 and extends through, e.g., fills or lines, openings 330. More particularly, localized RDL conductive layer 432 includes electrically conductive vias 434 within openings 330 and electrically connected to bond pads 214, 220 of electronic components 204, 208. Further, localized RDL conductive layer 432 includes electrically conductive traces 436 on localized RDL dielectric layer 328 and extending lengthwise in a direction parallel to active surfaces 212, 218. Traces 436 are electrically connected to vias 434. Bond pads 214A remain exposed.

In one embodiment, traces 436 include lands 438 for electrical connection to additional conductive layers as discussed further below. Traces 436 fan in the pattern of bond pads 214, 220 to the pattern of lands 438.

For example, bond pads 214, 220 are fine pitched bond pads adjacent the outer periphery of active surfaces 212, 218 designed for wire bonding. Traces 436 fan in the pattern of bond pads 214, 220 from the outer periphery of active surfaces 212, 218 to the pattern of lands 438 distributed, e.g., as an array, on active surfaces 212, 218. The pitch between lands 438 is greater than the fine pitch of band pads 214, 220. This provides additional space for routing additional interconnects as set forth below. Generally, localized RDL conductive layer 432 enables escape routing for multiple contact arrays.

Also, as illustrated by the center bond pad 220 of electronic component 208, in one embodiment, lands 438 are also formed directly upon vias 434.

Localized RDL conductive layer 432 is formed on electronic components 204, 208 post panelization, i.e., after electronic components 204, 208 are encapsulated in package body 226. This avoids performing the redistribution on electronic components 204, 208 while still in wafer form allowing electronic components 204, 208 to be sourced from multiple manufactures, e.g., OEMs.

Although vias 434 are illustrated in FIG. 4 as solid vias completely filling openings 330, in another embodiment, vias 434 are hollow vias that line the sidewall of openings 330 while leaving an empty space inside of vias 434 and openings 330. This empty space is subsequently filled with an overlying layer. Generally, filled vias are illustrated herein in the various figures. However, in other embodiments, instead of filled vias, hollow vias are formed and the empty space within the hollow vias is subsequently filled with an overlying layer.

Figure 5:
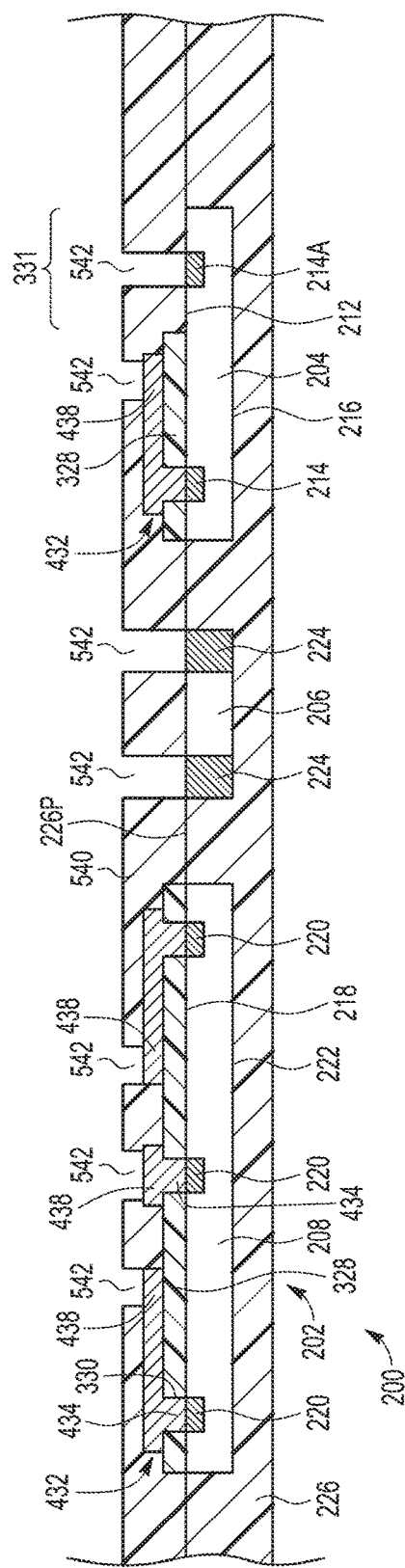

FIG. 5 is a cross-sectional view of embedded component package 200 of FIG. 4 at a further stage during fabrication in accordance with one embodiment. In FIG. 5, a first primary RDL dielectric layer 540 is formed (108).

Primary RDL dielectric layer 540 is blanket formed across the entire embedded component substrate 202. Primary RDL dielectric layer 540 completely covers the underlying structure and directly contacts localized RDL conductive layer 432, localized RDL dielectric layer 328, principle surface 226P of package body 226, and the exposed second portion 331 of electronic component 204.

In accordance with this embodiment, openings 542 are formed in primary RDL dielectric layer 540. Openings 542 expose lands 438 of localized RDL conductive layer 432, terminals 224 of electronic component 206, and the bond pads 214A of electronic component 208 that are uncovered by and exposed from localized RDL dielectric layer 328.

FIG. 6 is a cross-sectional view of embedded component package 200 of FIG. 5 at a further stage during fabrication in accordance with one embodiment. In FIG. 6, a primary RDL conductive layer 644 is formed (110). For example, an electrically conductive material is deposited and then etched to form primary RDL conductive layer 644. In another embodiment, electrically conductive material is selectively deposited, e.g., using a mask, to form primary RDL conductive layer 644.

Primary RDL conductive layer 644 is formed on primary RDL dielectric layer 540 and extends through, e.g., fills or lines, openings 542. More particularly, primary RDL conductive layer 644 includes electrically conductive vias 646 within openings 542. Vias 646 are electrically connected to lands 438 of localized RDL conductive layer 432, terminals 224 of electronic component 206, and bond pads 214A of electronic component 204 that are exposed from localized RDL dielectric layer 328.

Further, primary RDL conductive layer 644 includes electrically conductive traces 648 on primary RDL dielectric layer 540 and extending lengthwise in a direction parallel to active surfaces 212, 218. Traces 648 are electrically connected to vias 646.

In one embodiment, traces 648 include lands 650 for electrical connection to additional conductive layers as discussed further below. Traces 648 redistribute the pattern of lands 438, terminals 224, and bond pads 214A to the pattern of lands 650.

In one embodiment, one or more electronic components 652 are located on primary RDL dielectric layer 540. Illustratively, primary RDL conductive layer 644 itself is patterned into electronic component 652, e.g., an RF coil or antenna. However, in another embodiment, electronic component 652 is a separate structure mounted to primary RDL dielectric layer 540 and connected to primary RDL conductive layer 644.

Also, as illustrated above the center bond pad 220 of electronic component 208, in one embodiment, vias 646 are also formed directly upon vias 434 to form a stacked via 654. Stacked via 654 is used due to routing constraints for example. Localized RDL dielectric layer 328 on electronic component 208 operates as a stress buffer around stacked via 654.

As illustrated in FIG. 6, localized RDL conductive layer 432 is embedded within primary RDL dielectric layer 540. Localized RDL conductive layer 432 provides embedded localized smaller scale redistribution within primary RDL dielectric layer 540.

In one embodiment, localized RDL dielectric layer 328 is thinner than primary RDL dielectric layer 540. The thickness is measured in a direction perpendicular to active surfaces 212, 218. For example, the thickness of localized RDL dielectric layer 328 is within the range of 2 μm to 5 μm and the thickness of primary RDL dielectric layer 540 is within the range of 14 μm to 20 μm. Due to the reduced thickness of localized RDL dielectric layer 328, the diameter of openings 330 can be made smaller than the diameter of openings 542. Stated another way, small discrete openings 330 can be formed to expose fine pitch bond pads 214, 220.

Further, in one embodiment, localized RDL dielectric layer 328 is made of a material different than the material of primary RDL dielectric layer 540. For example, primary RDL dielectric layer 540 is epoxy, polyimide, benzocyclobutene (BCB), or polybenzoxazole (PBO). Examples of localized RDL dielectric layer 328 include polyimide, benzocyclobutene (BCB), polybenzoxazole (PBO), fluorinated polymer, or siloxane. Although various examples of dielectric materials for localized RDL dielectric layer 328 and primary RDL dielectric layer 540 are given, in other embodiments, other dielectric materials are used. Further, in one embodiment, the same dielectric material is used for both localized RDL dielectric layer 328 and primary RDL dielectric layer 540.

Further, in one embodiment, localized RDL conductive layer 432 is thinner than primary RDL conductive layer 644. For example, the thickness of localized RDL conductive layer 432 is 2 μm and the thickness of primary RDL conductive layer 644 is within the range of 4 μm to 10 μm. Due to the reduced thickness of localized RDL conductive layer 432, the feature size, e.g., the width and/or spacing between traces 436, of localized RDL conductive layer 432 can be made smaller than the feature size of primary RDL conductive layer 644. Due to the small feature size of localized RDL conductive layer 432, fine pitch features, e.g., bond pads 214, 220, can be readily redistributed allowing further integration and density of routing. Localized RDL conductive layer 432 is sometimes called a small form factor RDL.

FIG. 7 is a cross-sectional view of embedded component package 200 of FIG. 6 at a further stage during fabrication in accordance with one embodiment. In FIG. 7, a second localized RDL dielectric layer 756 is formed (112).

More particularly, localized RDL dielectric layer 756 is formed selectively, i.e., at selective locations and not blanket formed. In accordance with this embodiment, localized RDL dielectric layer 756 is formed only on electronic component 652, e.g., a RF coil or antenna. In one embodiment, localized RDL dielectric layer 756 is a low loss tangent dielectric material providing excellent insulation of electronic component 652 from conductive layers to be formed thereon as discussed further below. Low loss tangent'low dissipation factor dielectric materials are important when signal distortion must be minimized, and when signal integrity (SI) must be preserved. Loss tangent or dissipation factor is a measure of a dielectric material's tendency to absorb some of the energy from an electromagnetic (EM) field passing through the material. More particularly, using a low loss tangent dielectric material as localized RDL dielectric layer 756 allows other conductive layers to be formed on top of electronic component 652 reducing the size (footprint) of embedded component package 200.

In accordance with this embodiment, one or more openings 758, sometimes called via openings 758, are formed in localized RDL dielectric layer 756 to expose terminal(s) 760 of electronic component 652. However, in another embodiment, localized RDL dielectric layer 756 is formed without openings 758 and completely covers and electrically insulates electronic component 652.

Figure 8:
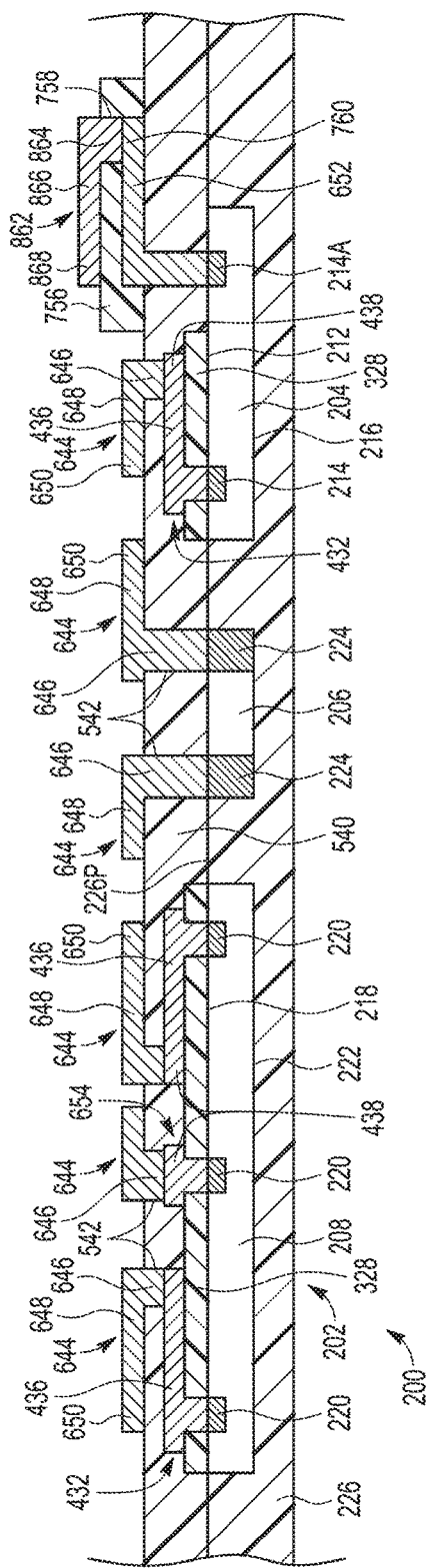

FIG. 8 is a cross-sectional view of embedded component package 200 of FIG. 7 at a further stage during fabrication in accordance with one embodiment. In FIG. 8, a localized RDL conductive layer 862 is formed (114) in a manner similar to that discussed above regarding localized RDL conductive layer 432 and so is only briefly discussed below.

Localized RDL conductive layer 862 is formed on localized RDL dielectric layer 756 and fills or lines openings 758. More particularly, localized RDL conductive layer 862 includes electrically conductive vias 864 within openings 758 and electrically connected to terminals 760 of electronic component 652. Further, localized RDL conductive layer 862 includes electrically conductive traces 866 on localized RDL dielectric layer 756 and extending lengthwise in a direction parallel to active surfaces 212, 218. Traces 866 are electrically connected to vias 864.

In one embodiment, traces 866 include lands 868 for electrical connection to additional conductive layers as discussed further below, Traces 866 redistribute the pattern of terminals 760 to the pattern of lands 868. This allows for added complexity and functionality while reducing the size (footprint) of embedded component package 200. However, in another embodiment, e.g., when openings 758 are not formed in localized RDL dielectric layer 756, operation 114 is not performed and thus localized RDL conductive layer 862 is not formed.

Figure 9:
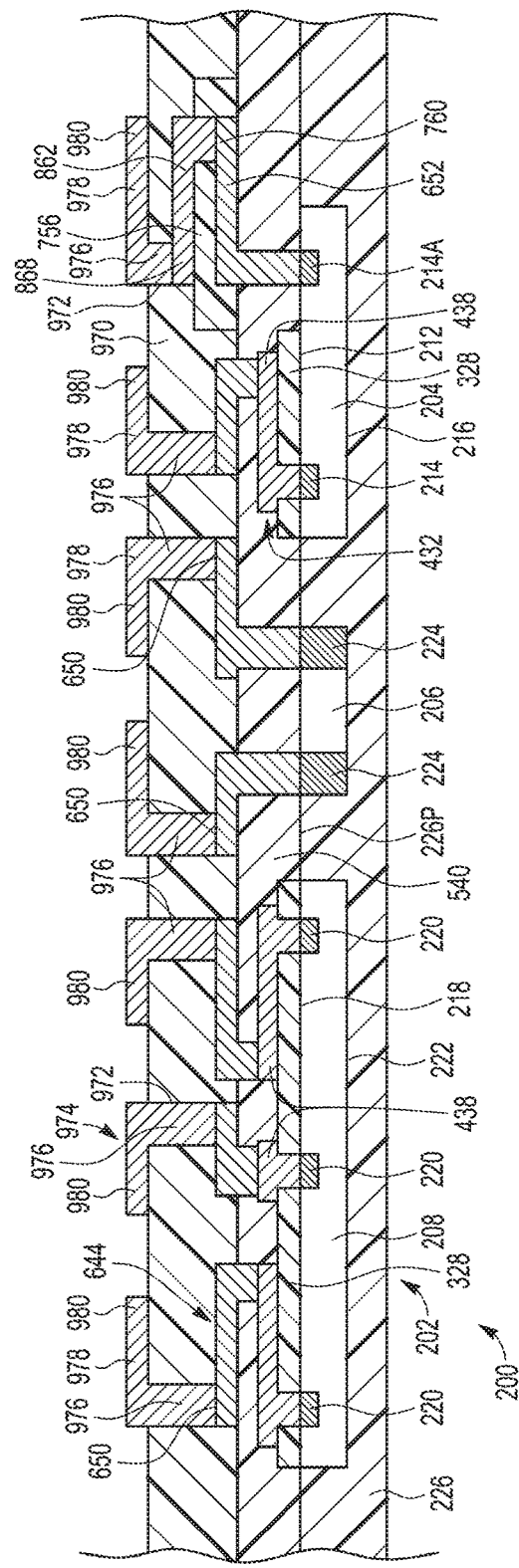

FIG. 9 is a cross-sectional view of embedded component package 200 of FIG. 8 at a further stage during fabrication in accordance with one embodiment. In FIG. 9, a second primary RDL dielectric layer 970 is formed (116).

Primary RDL dielectric layer 970 is similar to and formed in a similar manner as primary RDL dielectric layer 540 discussed above and so is only briefly discussed below. Primary RDL dielectric layer 970 is blanket formed and includes openings 972. Openings 972 expose lands 650 and lands 868.

Further, in FIG. 9, a second primary RDL conductive layer 974 is formed (118). Primary RDL conductive layer 974 is similar to and formed in a similar manner as primary RDL conductive layer 644 discussed above and so is only briefly discussed below.

Primary RDL conductive layer 974 is formed on primary RDL dielectric layer 970 and fills or lines openings 972. More particularly, primary RDL conductive layer 974 includes electrically conductive vias 976 within openings 972. Vias 976 are electrically connected to lands 650, 868. Further, primary RDL conductive layer 974 includes electrically conductive traces 978 on primary RDL dielectric layer 970 and extending lengthwise in a direction parallel to active surfaces 212, 218. Traces 978 are electrically connected to vias 976.

In one embodiment, traces 978 include lands 980 for electrical connection to additional conductive layers as discussed further below. Traces 978 redistribute the pattern of lands 650, 868 to the pattern of lands 980. Form additional primary RDL dielectric layer operation 116 and form additional primary RDL conductive layer operation 118 are repeated as many times as necessary until the desired redistribution is achieved.

Figure 10:
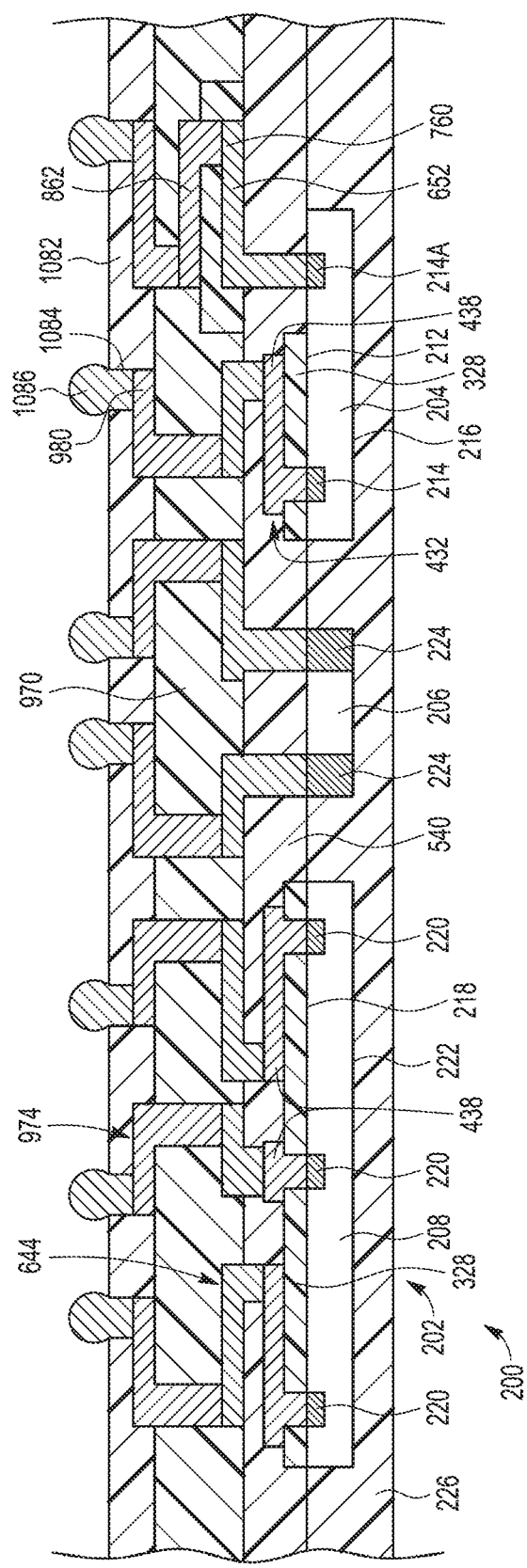

FIG. 10 is a cross-sectional view of embedded component package 200 of FIG. 9 at a further stage during fabrication in accordance with one embodiment. In FIG. 10, an outer dielectric layer 1082 is formed (120).

Outer dielectric layer 1082 is similar to and formed in a similar manner as primary RDL dielectric layer 970 discussed above and so is only briefly discussed below.

Outer dielectric layer 1082 is blanket formed and includes land openings 1084, Land openings 1084 expose lands 980. Outer dielectric layer 1082 is the outermost dielectric layer in accordance with this embodiment and electrically isolates principle RDL conductive layer 974 from the ambient environment.

Further, in FIG. 10, an interconnection structure 1086 is formed within land openings 1084 and on lands 980 (122). In one embodiment, interconnection structure 1086 includes a plurality of electrically conductive bumps, e.g., forming a ball grid array. Interconnection structure 1086 provides the structure for interconnection of embedded component package 200 with other structures, e.g., a printed circuit board.

In one embodiment, a plurality of embedded component packages 200 are formed simultaneously in an array. In accordance with this embodiment, the array is singulated to form a plurality of individual embedded component packages 200.

Although the invention is described herein with references to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    forming a first primary redistribution layer (RDL) dielectric layer on an embedded component substrate;
    forming a first primary RDL conductive layer on the first primary RDL dielectric layer;
    forming a localized RDL dielectric layer on the first primary RDL conductive layer; and
    forming a second primary RDL dielectric layer directly contacting the first primary RDL dielectric layer, the first primary RDL conductive layer, and the localized RDL dielectric layer.

2. The method of claim 1 wherein the first primary RDL conductive layer comprises an electronic component, the localized RDL dielectric layer covering the electronic component.

3. The method of claim 2 wherein the electronic component is selected from the group consisting of an antenna and a coil.

4. The method of claim 2 wherein the localized RDL dielectric layer comprises a low loss tangent dielectric material.

5. The method of claim 2 wherein the localized RDL dielectric layer completely covers the electric component.

6. The method of claim 2 further comprising:
    forming a localized RDL conductive layer on the localized RDL dielectric layer.

7. The method of claim 6 wherein the localized RDL conductive layer includes an electrically conductive via electrically coupled to a terminal of the electronic component.

8. The method of claim 6 wherein the second primary RDL dielectric layer directly contacts the localized RDL conductive layer.

9. The method of claim 6 wherein the localized RDL conductive layer includes conductive traces extending lengthwise in a direction parallel to a major surface of the embedded component substrate.

10. The method of claim 6 wherein the localized RDL conductive layer is coupled to the electronic component through an opening in the localized RDL dielectric layer.

11. The method of claim 6 wherein a thickness of the localized RDL conductive layer is less than a thickness of the first primary RDL conductive layer.

12. The method of claim 1 further comprising:
    mounting an electronic component to the primary RDL dielectric layer.

13. The method of claim 12 wherein the localized RDL dielectric layer covers the electronic component.

14. The method of claim 12 wherein the electronic component is selected from the group consisting of an antenna and a coil.

15. The method of claim 12 wherein the localized RDL dielectric layer comprises a low loss tangent dielectric material.

16. The method of claim 12 wherein the localized RDL dielectric layer completely covers the electric component.

17. The method of claim 1 further comprising:
    forming a localized RDL conductive layer on the localized RDL dielectric layer.

18. The method of claim 17 wherein the second primary RDL dielectric layer directly contacts the localized RDL conductive layer.

19. The method of claim 17 wherein the localized RDL conductive layer includes conductive traces extending lengthwise in a direction parallel to a major surface of the embedded component substrate.

20. The method of claim 17 wherein the localized RDL conductive layer is coupled to the electronic component through an opening in the localized RDL dielectric layer.

* * * * *